United States Patent
Kasuya et al.

(10) Patent No.: US 12,038,696 B2
(45) Date of Patent: Jul. 16, 2024

(54) LIGHT EMITTING DEVICE AND DRAWING APPARATUS

(71) Applicant: FUJIFILM Business Innovation Corp., Tokyo (JP)

(72) Inventors: Yosuke Kasuya, Ebina (JP); Takahiko Kobayashi, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 9 days.

(21) Appl. No.: 17/875,073

(22) Filed: Jul. 27, 2022

(65) Prior Publication Data

US 2022/0365460 A1  Nov. 17, 2022

Related U.S. Application Data

(63) Continuation of application No. PCT/JP2020/026720, filed on Jul. 8, 2020.

(30) Foreign Application Priority Data

Mar. 25, 2020 (JP) .................................. 2020-054929

(51) Int. Cl.
  *G03G 15/04*   (2006.01)
  *G03G 15/043*   (2006.01)

(52) U.S. Cl.
  CPC ... *G03G 15/04036* (2013.01); *G03G 15/0435* (2013.01); *G03G 2215/0407* (2013.01)

(58) Field of Classification Search
  CPC ......... G03G 15/04036; G03G 15/0435; G03G 2215/0407; B41J 2/447; B41J 2/45;
  (Continued)

(56) References Cited

U.S. PATENT DOCUMENTS 6,538,679 B2   3/2003  Hiyoshi
7,513,639 B2   4/2009  Wang
              (Continued)

FOREIGN PATENT DOCUMENTS

JP   2002-137438 A   5/2002
JP   2009-154361 A   7/2009
              (Continued)

OTHER PUBLICATIONS

Sep. 15, 2020 International Search Report issued in International Patent Application No. PCT/JP2020/026720.
(Continued)

*Primary Examiner* — Walter L Lindsay, Jr.
*Assistant Examiner* — Geoffrey T Evans
(74) *Attorney, Agent, or Firm* — Oliff PLC

(57) ABSTRACT

A light emitting device includes: a base that extends in one direction and that is formed of a metal block; plural light emitters that are disposed on a front surface side of the base so as to be displaced from each other in the one direction and in each of which plural light sources that are arranged in the one direction are supported by a support that extends in the one direction; and a protective member that is provided at an end portion of the base in a direction intersecting the one direction, that is disposed on a lateral side of the plural light emitters so as to extend in the one direction, and that protects the plural light emitters from outside.

15 Claims, 10 Drawing Sheets

(58) Field of Classification Search
CPC . B41J 2/455; H01L 33/00; H01S 5/40; H04N 1/036
See application file for complete search history.

(56) References Cited

U.S. PATENT DOCUMENTS

| | | | |
|---|---|---|---|
| 9,981,482 B2 | 5/2018 | Tanaka | |
| 10,691,041 B2 * | 6/2020 | Kida | G02B 3/0037 |
| 2002/0051049 A1 | 5/2002 | Hiyoshi | |
| 2017/0282593 A1 | 10/2017 | Tanaka | |

FOREIGN PATENT DOCUMENTS

| | | |
|---|---|---|
| JP | 2015-066835 A | 4/2015 |
| JP | 2017-177664 A | 10/2017 |
| JP | 2018-142447 A | 9/2018 |
| JP | 2018-166127 A | 10/2018 |
| WO | 2012/109669 A1 | 8/2012 |

OTHER PUBLICATIONS

Sep. 15, 2020 Written Opinion of the International Searching Authority issued in International Patent Application No. PCT/JP2020/026720.

Aug. 10, 2023 Office Action Issued in Japanese Patent Application No. 2020-054929.

\* cited by examiner

LIGHT EMITTING DEVICE AND DRAWING APPARATUS

CROSS-REFERENCE TO RELATED APPLICATIONS

This is a continuation of International Application No. PCT/JP2020/026720 filed on Jul. 8, 2020, and claims priority from Japanese Patent Application No. 2020-054929 filed on Mar. 25, 2020, the entire disclosures of which are incorporated herein by reference.

BACKGROUND

(i) Technical Field

The present disclosure relates to a light emitting device and a drawing apparatus.

(ii) Related Art

Japanese Unexamined Patent Application Publication No. 2017-177664 discloses an exposure device including a first exposure head and a second exposure head. The first exposure head includes: plural first light-emitting elements that are arranged in a first direction and each of which emits a first light beam; a first optical system that is disposed so as to face the plural first light-emitting elements in a second direction intersecting the first direction and that performs imaging of each of the first light beams that are respectively emitted from the plural first light-emitting elements; a first coupler; and a first base member that supports the plural first light-emitting elements, the first optical system, and the first coupler. The second exposure head includes: plural second light-emitting elements that are arranged in the first direction and each of which emits a second light beam; a second optical system that is disposed so as to face the plural second light-emitting elements in the second direction and that performs imaging of each of second light beams that are respectively emitted from the plural second light-emitting elements; a second coupler that is fitted into the first coupler; and a second base member that supports the plural second light-emitting elements, the second optical system, and the second coupler. In the exposure device, the first coupling is provided at a position in the first base corresponding to an image-forming position of the first optical system, and the second coupling is provided at a position in the second base corresponding to an image-forming position of the second optical system.

SUMMARY

Aspects of non-limiting embodiments of the present disclosure relate to a light emitting device and a drawing apparatus with which an impact on a component of a light-emitting unit when the light emitting device falls sideways is suppressed, compared with a case where a light emitter is exposed to the outside.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting device including: a base that extends in one direction and that is formed of a metal block; plural light emitters that are disposed on a front surface side of the base so as to be displaced from each other in the one direction, and in each of which plural light sources that are arranged in the one direction are supported by a support that extends in the one direction; and a protective member that is provided at an end portion of the base in a direction intersecting the one direction, that is disposed on a lateral side of the plural light emitters so as to extend in the one direction, and that protects the plural light emitters from outside.

BRIEF DESCRIPTION OF THE DRAWINGS

Exemplary embodiments of the present disclosure will be described in detail based on the following figures, wherein.

DETAILED DESCRIPTION

Hereafter, exemplary embodiments of the present disclosure (hereafter, each referred to as "the present exemplary embodiment") will be described.

First Exemplary Embodiment

Image Forming Apparatus 10

Figure 1:
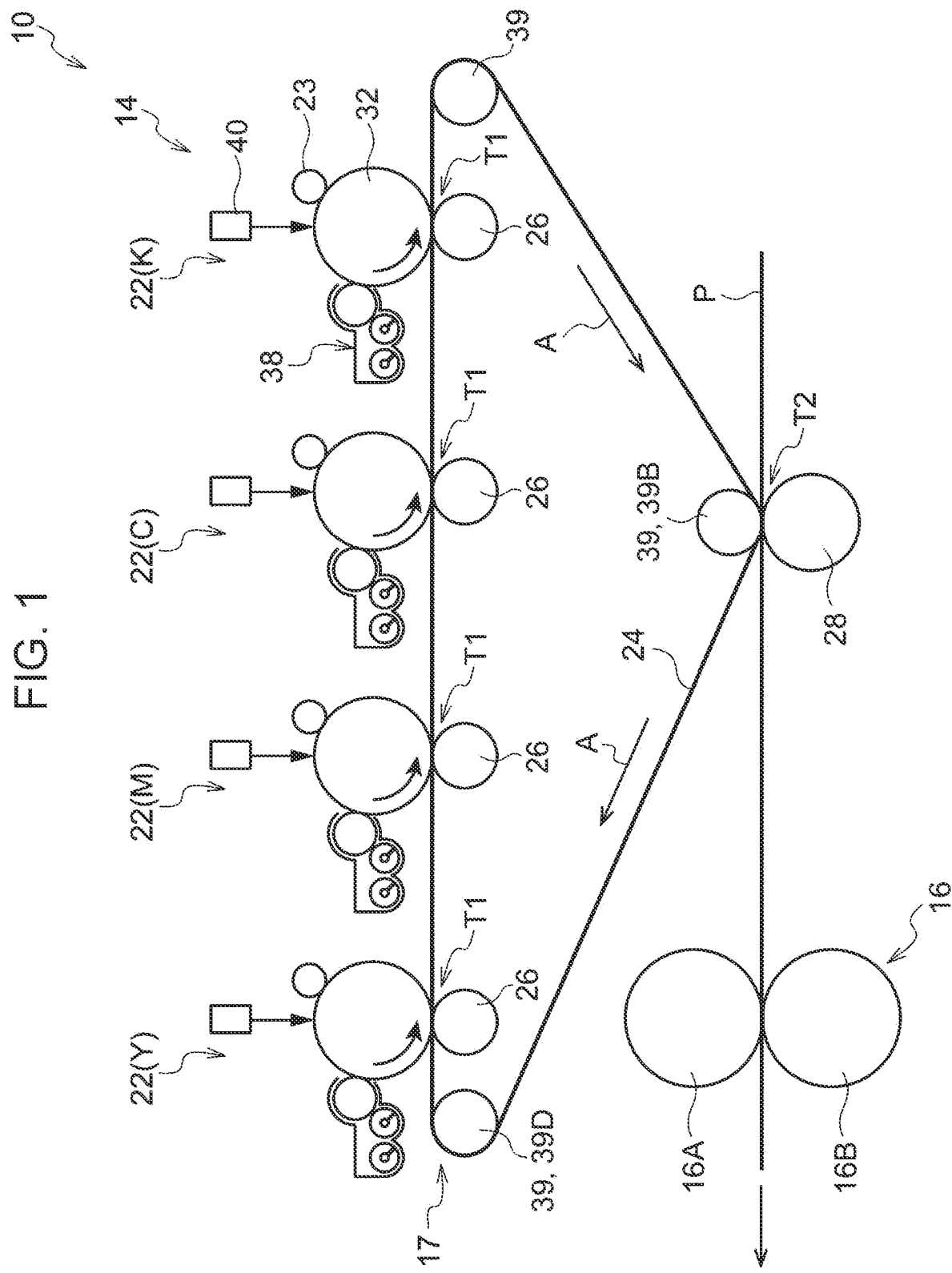
FIG. 1 is a schematic view of an image forming apparatus including an exposure device according to a first exemplary embodiment.

FIG. 1 is a schematic view of an image forming apparatus 10 including an exposure device 40 according to a first exemplary embodiment. First, the configuration of the image forming apparatus 10 will be described. Next, the exposure device 40 used in the image forming apparatus 10 will be described. Here, the image forming apparatus 10 is an example of a drawing apparatus, and the exposure device 40 is an example of a light emitting device. The image forming apparatus 10 is, as an example, an image forming apparatus that forms an image in plural colors, and is, for example, a full-color printer for commercial printing for which particularly high image quality is required.

The image forming apparatus 10 is a wide image forming apparatus that can form an image having a width that is larger than the width of a B3 portrait recording medium P (that is, a width larger than 364 mm). As an example, the image forming apparatus 10 can form an image on a recording medium P whose width is 420 mm (A2 portrait) or larger and 1456 mm (B0 landscape) or smaller. For example, the image forming apparatus 10 can form an image on a recording medium whose width is 728 mm (B2 landscape).

The image forming apparatus 10 illustrated in FIG. 1 is an example of an image forming apparatus that forms an image on a recording medium. To be specific, the image forming apparatus 10 is an electrophotographic image forming apparatus that forms a toner image (an example of an image) on a recording medium P. Toner is an example of a powder. To be more specific, the image forming apparatus 10 includes an image forming section 14 and a fixing device 16. Hereafter, parts of the image forming apparatus 10 (the image forming section 14 and the fixing device 16) will be described.

Image Forming Section 14

The image forming section 14 has a function of forming a toner image on the recording medium P. To be specific, the image forming section 14 includes toner-image forming units 22 and a transfer device 17.

Toner Image Forming Unit 22

The toner-image forming units 22 illustrated in FIG. 1 form toner images in respective colors. In the present exemplary embodiment, four toner-image forming units 22 for four colors, which are yellow (Y), magenta (M), cyan (C), and black (K), are provided. The symbols (Y), (M), (C), and (K) shown in FIG. 1 represent constituent parts for the above colors.

In FIG. 1, reference numerals are attached to parts of the toner-image forming unit 22(K) as a representative of the toner-image forming units 22 for the respective colors, because the toner-image forming units 22 for the respective colors are configured similarly except for toners used.

To be specific, the toner-image forming units 22 for the respective colors each include a photoconductor drum 32 that rotates in one direction (for example, the counterclockwise direction in FIG. 1). Here, the photoconductor drum 32 is an example of a cylindrical member, and a photoconductor on the surface of the photoconductor drum 32 is an example of a region where a photosensitive material is disposed. Further, the toner-image forming units 22 for the respective colors each include a charger 23, the exposure device 40, and a developing device 38.

In each of the toner-image forming units 22 for the respective colors, the charger 23 charges the photoconductor drum 32. Moreover, the exposure device 40 exposes the photoconductor drum 32, which has been charged by the charger 23, to light to form an electrostatic latent image on the photoconductor drum 32. The developing device 38 develops the electrostatic latent image, which has been formed on the photoconductor drum 32 by the exposure device 40, to form a toner image.

The photoconductor drum 32 rotates while holding the electrostatic latent image formed as described above on an outer periphery thereof to transport the electrostatic latent image to the developing device 38. Specific configurations of the exposure device 40 will be described below.

Transfer Device 17

The transfer device 17 illustrated in FIG. 1 transfers the toner image formed by the toner-image forming unit 22 to the recording medium P. To be specific, the transfer device 17 first-transfers toner images in the respective colors on the photoconductor drums 32 overlappingly onto a transfer belt 24 as an intermediate transfer member, and then second-transfers the overlapping toner images onto the recording medium P. To be specific, as illustrated in FIG. 1, the transfer device 17 includes the transfer belt 24, first-transfer rollers 26, and a second-transfer roller 28.

The first-transfer rollers 26 are rollers that transfer the toner images on the photoconductor drums 32 for the respective colors onto the transfer belt 24 at first-transfer positions T1 between the photoconductor drum 32 and the first-transfer rollers 26. In the present exemplary embodiment, because first transfer electric fields are applied between the first-transfer rollers 26 and the photoconductor drums 32, the toner images formed on the photoconductor drums 32 are transferred to the transfer belt 24 at the first-transfer positions T1.

The toner images are transferred from the photoconductor drums 32 for the respective colors to the outer peripheral surface of the transfer belt 24. To be specific, the transfer belt 24 is configured as follows. As illustrated in FIG. 1, the transfer belt 24 is ring-shaped and positioned by being looped over plural rollers 39.

The transfer belt 24 circulates in the direction of arrow A because, for example, a driving roller 39D, which is one of the plural rollers 39, is rotated by a driving unit (not shown). A roller 39B illustrated in FIG. 1, which is one of the plural rollers 39, is an opposing roller 39B that faces the second-transfer roller 28.

The second-transfer roller 28 is a roller that transfers the toner images, which have been transferred to the transfer belt 24, to the recording medium P at a second-transfer position T2 between the opposing roller 39B and the second-transfer roller 28. In the present exemplary embodiment, because a second-transfer electric field is applied to the gap between the opposing roller 39B and the second-transfer roller 28, the toner images, which have been transferred to the transfer belt 24, are transferred to the recording medium P at the second-transfer position T2.

Fixing Device 16

The fixing device 16 illustrated in FIG. 1 fixes the toner images, which have been transferred to the recording medium P, to the recording medium P by using the second-transfer roller 28. To be specific, as illustrated in FIG. 1, the fixing device 16 includes a heating roller 16A as a heating member and a pressing roller 16B as a pressing member. The fixing device 16 heats and presses the recording medium P by using the heating roller 16A and the pressing roller 16B to fix the toner images, which have been formed on the recording medium P, to the recording medium P.

Exposure Device 40

Figure 2:
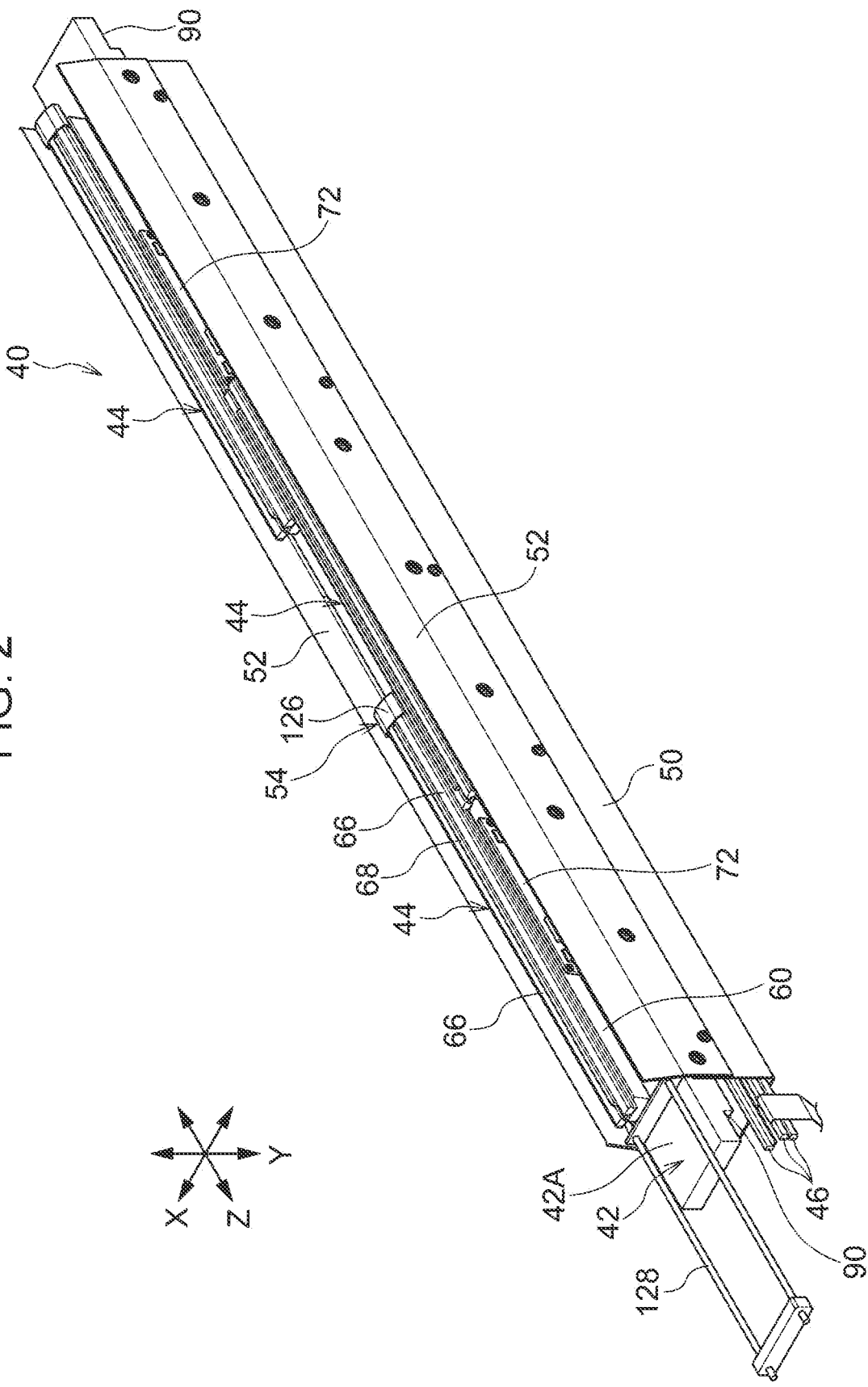
FIG. 2 is a perspective view of the exposure device used in the image forming apparatus.
Figure 3:
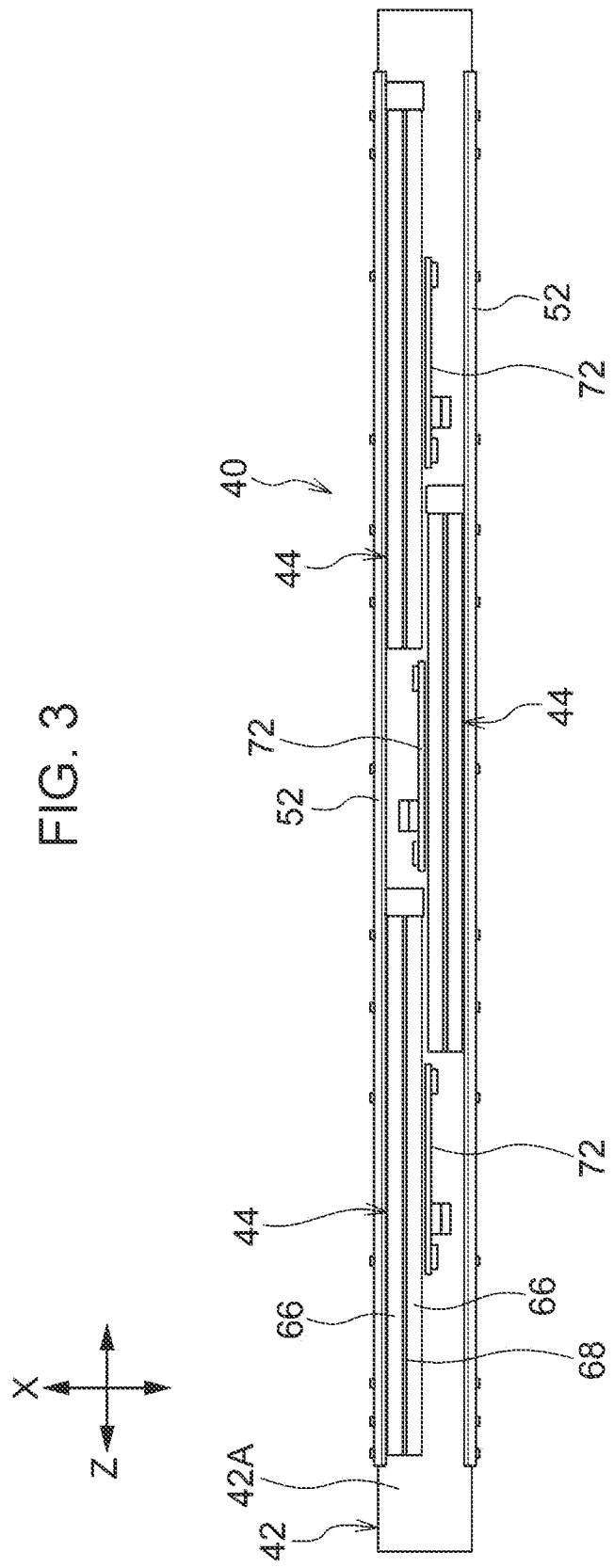
FIG. 3 is a top view of the exposure device.

Next, the exposure device 40, which is a part of the present exemplary embodiment, will be described. FIG. 2 is a perspective view of the exposure device 40. FIG. 3 is a top view of the exposure device 40. In the following description, it is assumed that the direction of arrow X is the width direction of the exposure device 40 and the direction of arrow Y is the height direction of the exposure device 40. It is assumed that the direction of arrow Z, which is perpendicular to the width direction and the height direction, is the depth direction of the exposure device 40. The width direction and the height direction, which are defined for convenience of description, do not limit the configuration of the exposure device 40.

Overall Configuration of Exposure Device 40

First, the overall configuration of the exposure device 40 will be described, and next, members of the exposure device 40 will be described.

As illustrated in FIGS. 2 and 3, the exposure device 40 includes a base 42 that extends in one direction (the direction of arrow Z in the present exemplary embodiment), and plural light emitters 44 that are provided on one side of the base 42 in the direction of arrow Y (the upper side of the base 42 in the up-down direction of FIGS. 2 and 3). In the present exemplary embodiment, three light emitters 44 that extend in the one direction of the base 42 are provided. The base 42 is an elongated rectangular member in a plan view as illustrated in FIG. 3. The light emitters 44 have the same configuration and are each an elongated rectangular member in a plan view as illustrated in FIG. 3. The length of each light emitter 44 in the one direction (that is, the longitudinal direction) is shorter than the length of the base 42 in the one direction (that is, the longitudinal direction).

As an example, the three light emitters 44 are disposed so as to be displaced from each other in the one direction of the base 42 (the direction of arrow Z), and are disposed so as to be displaced from each other in the width direction perpendicular to the one direction of the base 42, that is, the transversal direction of the base 42 (the direction of arrow X). The exposure device 40 is disposed so as to extend in the axial direction of the photoconductor drum 32 (see FIG. 1), and the length of the exposure device 40 in the one direction (the direction of arrow Z) is larger than or equal to the length of the photoconductor drum 32 in the axial direction. One or more of the three light emitters 44 face a region of the surface of the photoconductor drum 32 where a photoconductor is provided. Thus, the surface of the photoconductor drum 32 is to be irradiated with light from the exposure device 40.

In the exposure device 40 illustrated FIGS. 2 and 3 and other figures, the side of the base 42 on which the light emitters 44 are provided is the upper side in the up-down direction, and light is emitted toward the upper side from the light emitters 44. However, the exposure device 40 is illustrated upside down in the image forming apparatus 10 illustrated in FIG. 1. That is, in FIG. 1, the exposure device 40 is disposed so that the side of the base 42 on which the light emitters 44 are provided is the lower side in the up-side direction, and light is emitted from the light emitters 44 toward the photoconductor drum 32 on the lower side.

In the present exemplary embodiment, the three light emitters 44 are disposed in a staggered pattern as seen from the upper side of the exposure device 40 in the up-down direction (see FIG. 3). To be more specific, at both end portions of the base 42 in the one direction (the direction of arrow Z), two light emitters 44 are disposed on one side in the transversal direction of the base 42 (the direction of arrow X). At a middle part of the base 42 in the one direction (the direction of arrow Z), one light emitter 44 is disposed on the other side of the base 42 in the transversal direction (the direction of arrow X). End portions of the two light emitter 44 disposed on the one side of the base 42 in the transversal direction (the direction of arrow X) and end portions of the one light emitter 44 disposed on the other side of the base 42 in the transversal direction (the direction of arrow X) overlap each other as seen in the transversal direction of the base (the direction of arrow X). That is, the irradiation ranges of light from the three light emitters 44 partially overlap in the one direction of the base 42 (the direction of arrow Z).

The two light emitters 44 disposed on the one side of the base 42 in the transversal direction (the direction of arrow X) and the one light emitter 44 disposed on the other side of the base 42 in the transversal direction (the direction of arrow X) do not overlap as seen in the one direction of the base 42 (the direction of arrow Z).

Figure 4:
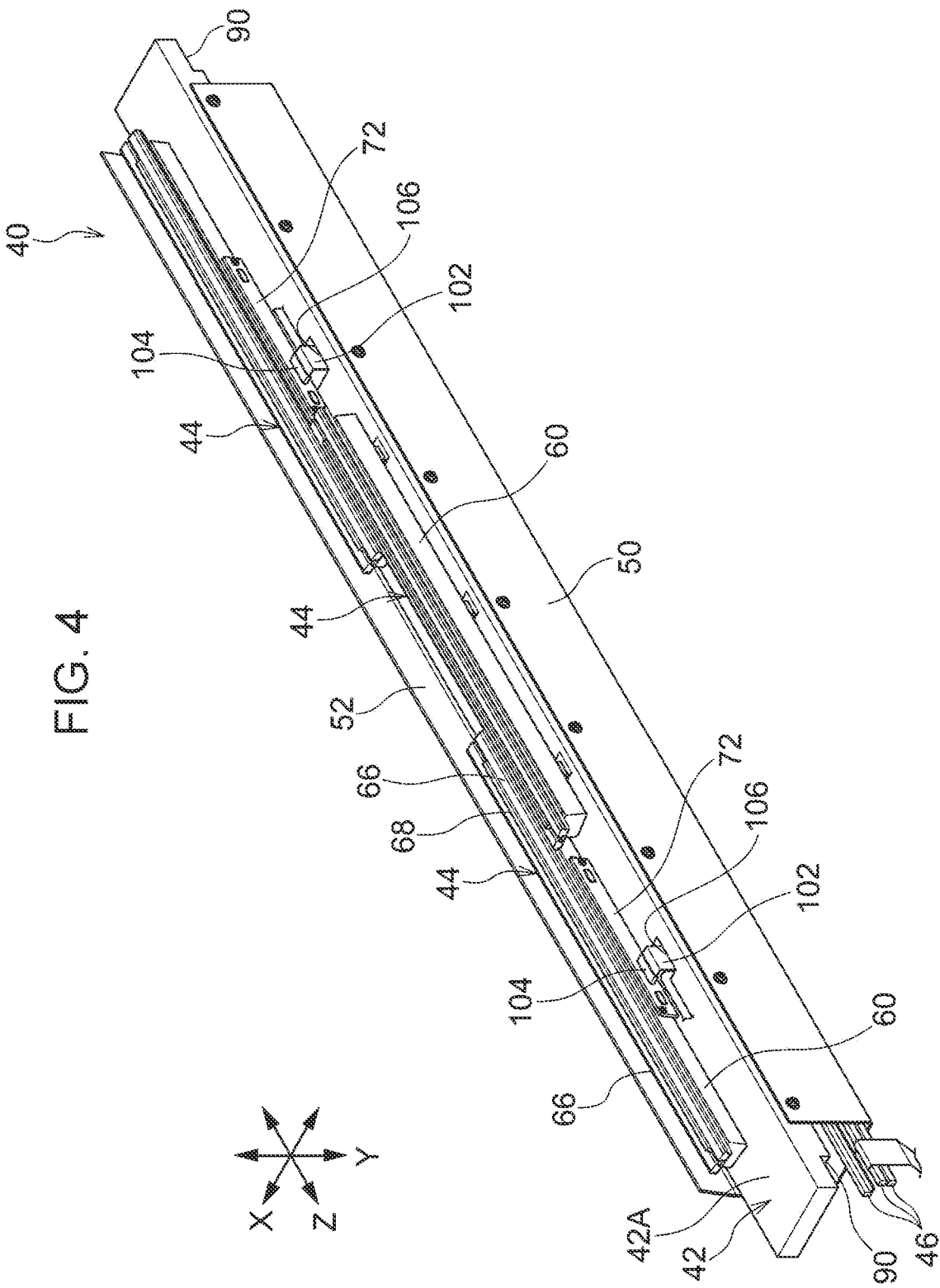
FIG. 4 is a perspective view illustrating plural light emitters of the exposure device.
Figure 5:
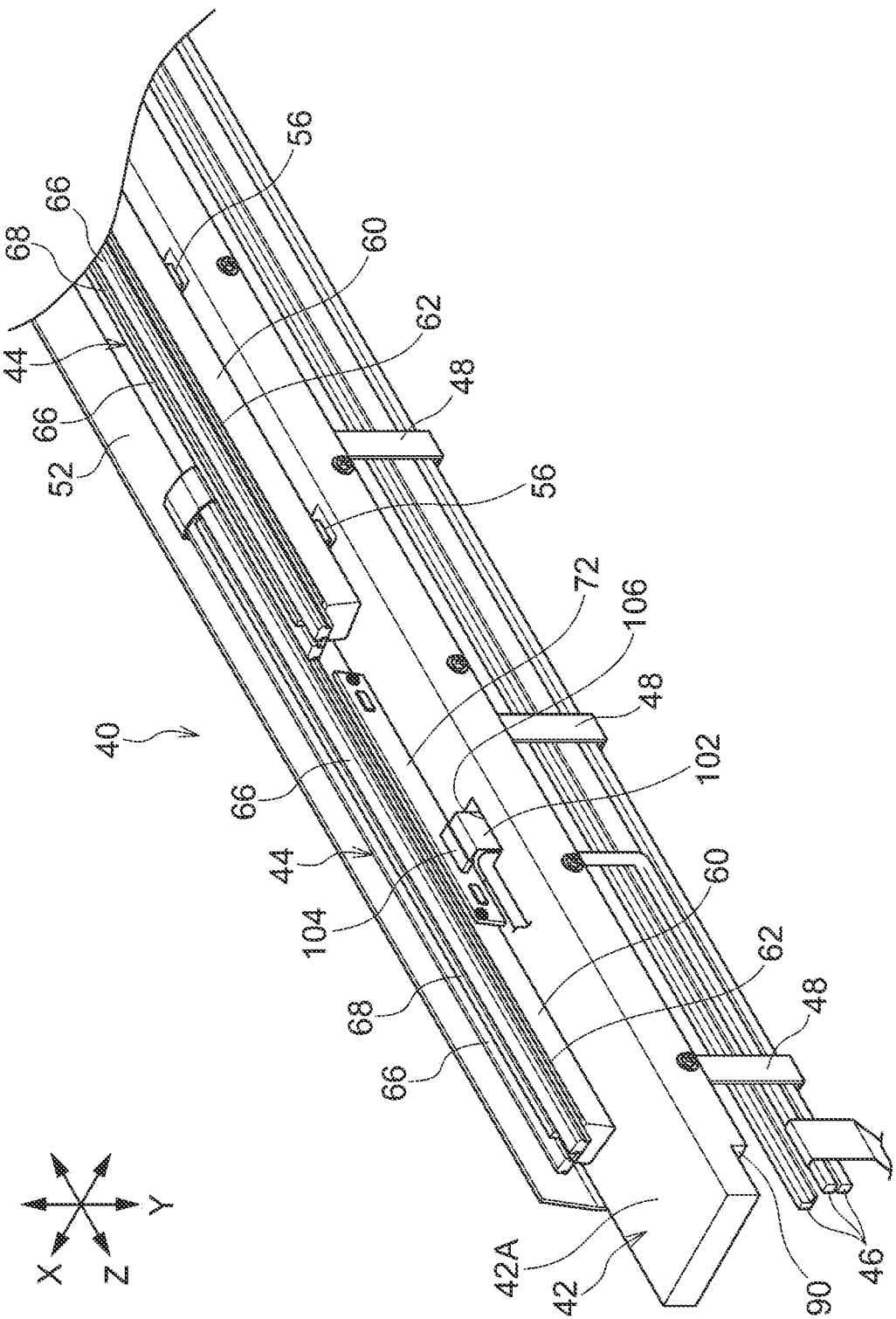
FIG. 5 is an enlarged partial perspective view of the exposure device.

As illustrated in FIGS. 4 and 5, the exposure device 40 includes harnesses 46 that are respectively electrically connected to the three light emitters 44, plural brackets 48 that hold the harnesses 46, and a lower cover 50 that covers the harnesses 46 and the brackets 48 from the outside. The harnesses 46 are an assembly in which plural wires used for power supply are bundled. Here, the brackets 48 are an example of a holding member and an example of another member. The lower cover 50 is an example of another member. The brackets 48 are attached to the base 42 and extend from the base 42 toward the other side in the direction of arrow Y (the lower side in the up-down direction on FIG. 2). The lower cover 50 is attached to the other side of the base 42 in the direction of arrow Y (the lower side in the up-down direction in FIG. 2).

As illustrated in FIGS. 2 and 3, the exposure device 40 includes side covers 52 that cover the lateral sides of the three light emitters 44. Lower end portions of the side covers 52 are attached to both sides of the base 42 in the transversal direction (the direction of arrow X). Here, the side covers 52 are an example of a protective member. The exposure device 40 includes a cleaning device 54 that cleans a lens portion 68 (described below) of the light emitter 44.

Figure 6:
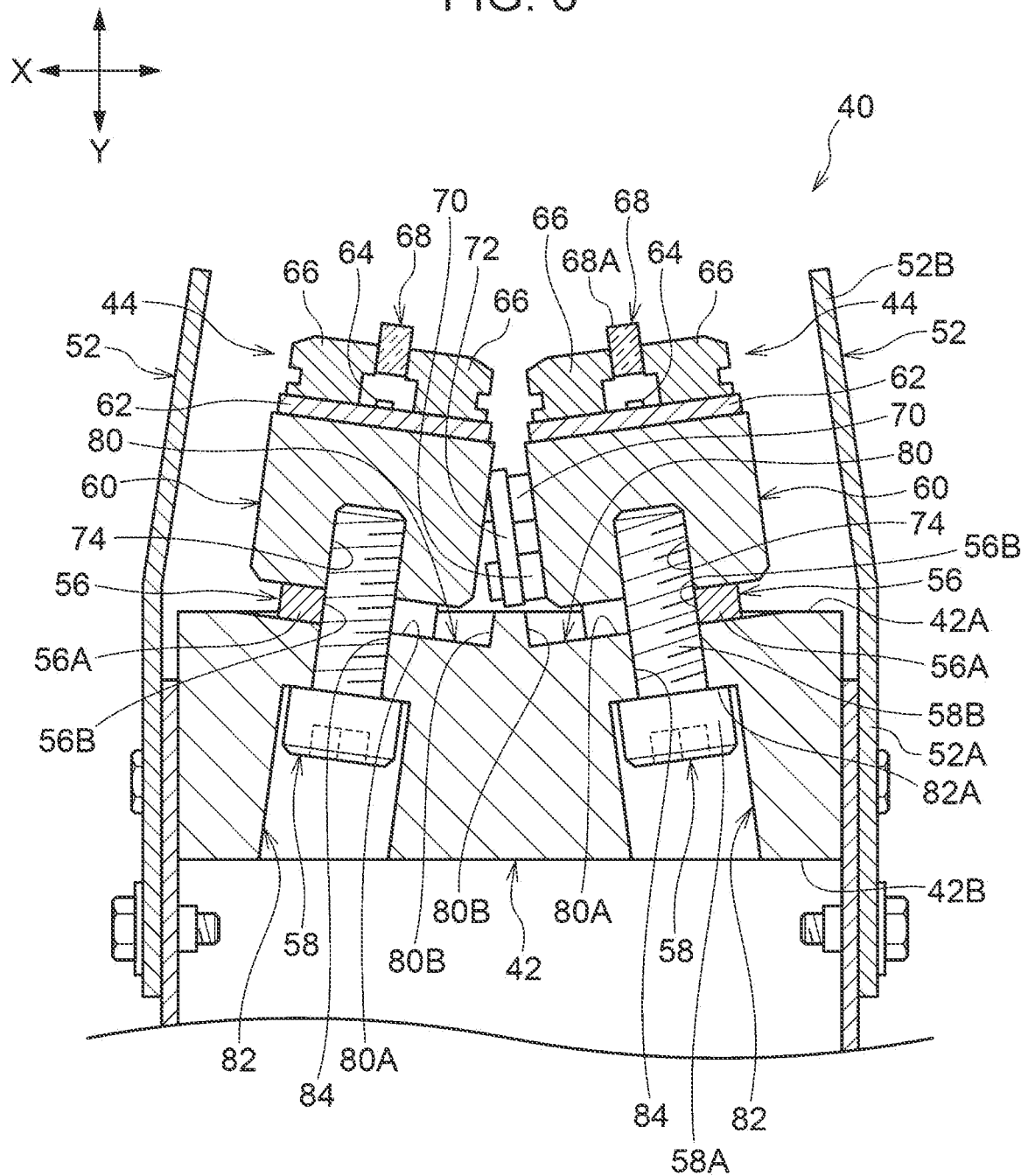
FIG. 6 is a sectional view illustrating plural light emitters of the exposure device that are cut in a transversal direction.

Moreover, as illustrated in FIGS. 5 and 6, the exposure device 40 includes plural spacers 56 that are interposed between the base 42 and the light emitters 44, and fastening members 58 that fix the light emitters 44 to the base 42 with the plural spacers 56 interposed therebetween. Each of the fastening members 58 is, for example, a member that has a helical groove and that performs fastening by using the groove. In other words, the fastening member 58 is a member having a screw mechanism, such as a screw, a bolt, or the like.

Although illustration is omitted, positioning shafts, which extend toward the upper side in the up-down direction, are provided at both end portions of the base 42 in the one direction (the direction of arrow Z). The positioning shafts position the exposure device 40 relative to the photoconductor drum 32 in the irradiation direction by being in contact with paring members that are provided at both ends the photoconductor drum 32.

Base 42

As illustrated in FIGS. 5 to 8, the base 42 is formed of an elongated rectangular-parallelepiped member. The base 42 is disposed at a position that faces the entire length of the photoconductor drum 32 (FIG. 1) in the axial direction.

Recesses 80, in which the spacers 56 are placed (see FIG. 6), are provided in a front surface 42A on the upper side of the base 42 in the up-down direction (the direction of arrow Y). As an example, three spacers 56 are disposed for one light emitter 44 at intervals in the one direction (the direction of arrow Z). In the present exemplary embodiment, three spacers 56 are disposed for each of the three light emitters 44.

The recesses 80 each include an inclined surface 80A that forms a bottom surface and that is inclined with respect to the front surface 42A of the base 42, a vertical wall 80B that is provided at an end portion of the inclined surface 80A in the descending direction, and two vertical walls (not shown) that are disposed so as to face both sides of the inclined surface 80A (see FIG. 5). As an example, inclined surfaces 80A for the two light emitters 44 that are disposed on one side of the base 42 in the transversal direction and an inclined surface 80A for the one light emitter 44 that is disposed on the other side of the base 42 in the transversal direction of the base 42 are inclined in the opposite directions. Due to the inclined surfaces 80A that are inclined in the opposite directions, the exposure device 40 is adjusted so as to emit light toward a central part of the photoconductor drum 32 (see FIG. 1) from the two light emitters 44 that are disposed on one side of the base 42 in the transversal direction and the one light emitter 44 that is disposed on the other side of the base 42 in the transversal direction.

In the present exemplary embodiment, the base 42 is formed of a metal block. A "metal block" in the present exemplary embodiment does not include a general metal plate that forms a shape by being bent, and refers to a block of metal that has a thickness such that the block cannot be substantially bent into a shape that is used as the base of the exposure device 40. As an example, the thickness of the metal block is 10% or more of the width of the base 42. Alternatively, the base 42 may be formed of a metal block such that the thickness of the base 42 is 20% or more and 100% or less of the width of the base 42.

Existing image forming apparatuses for wide width are used to output monochrome images for which high image quality is not required, compared to full color printers for commercial printing, and a metal plate is used for the base thereof. On the other hand, high image quality is required for the image forming apparatus 10 according to the present exemplary embodiment that is a full-color printer for commercial printing. For this reason, a metal block, which has a higher rigidity than a metal plate, is used in order to suppress an influence on image quality due to warping of the base 42.

The base 42 is made of, for example, steel or stainless steel. Here, the base 42 may be formed of a metal block that is made of a metal other than steel or stainless steel. For example, aluminum, which has a higher heat conductivity and a lighter weight than steel or stainless steel, may be used. However, in the present exemplary embodiment, heat of light sources 64 is dissipated by a support 60. Thus, steel or stainless steel is used as the material of the base 42 to prioritize rigidity over thermal conductivity and weight.

The thickness of the base 42 in the up-down direction (the direction of arrow Y) may be larger than the thickness of the support 60 of the light emitter 44. Thus, the rigidity (bending rigidity in the direction of arrow Y) of the base 42 is higher than the rigidity of the light emitter 44. The thickness of the base 42 in the up-down direction (the direction of arrow Y) is preferably 5 mm or larger, more preferably 10 mm or larger, and further preferably 20 mm or larger.

As illustrated in FIG. 6, in a back surface 42B of the base 42, which is opposite to the front surface 42A, recessed portions 82 that are recessed toward the spacers 56, that is, toward the recesses 80 are formed. The recessed portions 82 are respectively provided at positions corresponding to the recesses 80 of the base 42. The recessed portions 82 are formed in oblique directions from the back surface 42B of the base 42 toward a middle part of the base 42 in the transversal direction (X direction). For example, each of the recessed portions 82 is circular as seen from the back surface 42B of the base 42. The inside diameter of the recessed portions 82 is larger than the outside diameter of head portions 58A of the fastening members 58. Through-holes 84, through which shaft portions 58B of the fastening members 58 extend through the base 42, are formed in a bottom surface 82A of the recessed portions 82. The through-holes 84 open in the inclined surfaces 80A of the recesses 80.

As illustrated in FIGS. 4 and 5, handle portions 90, which are recessed from the back surface 42B, are formed at both end portions of the base 42 in the one direction (the direction of arrow Z). The shapes of the handle portions 90 are symmetric in the one direction of the base 42 (the direction of arrow Z). As an example, the handle portions 90 are formed by cutting out corners of the back surface 42B of the base 42 in the transversal direction (X direction), and are recessed portions formed in the back surface 42B of the base 42. The handle portions 90 have shapes that enable an operator to insert his/her fingers from both sides in the one direction of the base 42 (the direction of arrow Z) in a state in which the back surface 42B of the base 42 is placed on a flat surface.

Light Emitter 44

As illustrated in FIGS. 2 to 8, the three light emitters 44 have similar configurations as described above. As an example, the two light emitters 44 on the one side in the transversal direction of the base 42 (the direction of arrow X) and the one light emitter 44 on the other side in the transversal direction of the base 42 (the direction of arrow X) are disposed so as to be symmetrical in the transversal direction of the base 42 (the direction of arrow X).

As illustrated in FIG. 6, the light emitter 44 includes the support 60 that extends in the one direction (the direction of arrow Z) and a light-emitting element substrate 62 that is supported on a surface of the support 60 on a side opposite to the base 42 in the up-down direction (the direction of arrow Y) (in the present exemplary embodiment, an upper surface in the up-down direction). Plural light sources 64 that are arranged in the one direction are provided on the light-emitting element substrate 62. In the present exemplary embodiment, the light sources 64 include, for example, plural light-emitting elements. As an example, each light source 64 is a light-emitting element array including a semiconductor substrate, and plural light-emitting elements that are formed on the semiconductor substrate so as to be arranged in the one direction. In the present exemplary embodiment, light-emitting element arrays, which are the light sources 64, are arranged in a staggered pattern in the one direction on the light-emitting element substrate 62. The light source 64 need not be a light-emitting element array, and may be a single light-emitting element. Each light-emitting element is formed of a light-emitting diode, a light-emitting thyristor, a laser element, or the like. In a state of being arranged in one direction, the light-emitting elements have, as an example, a resolution of 2400 dpi. The light-emitting element substrate 62 is a substrate for causing one or more of the plural light sources 64 to emit light. In FIG. 6, one of the light sources 64 provided in each light emitter 44 is illustrated, and illustration of the other light sources is omitted.

The light emitter 44 includes a pair of attachment portions 66 that are provided on a surface of the light-emitting element substrate 62 opposite to the support 60, and the lens portion 68 that is held in a state of being interposed between upper end portions of the pair of attachment portions 66.

The pair of attachment portions 66 and the lens portion 68 extend in the one direction of the support 60 (the direction of arrow Z) (see FIG. 4 and other figures). The lens portion 68 is disposed at a position that faces the plural light sources 64, and a space is formed between the lens portion 68 and the plural light sources 64. With the exposure device 40, light from the plural light sources 64 passes through the lens portion 68, and the surface of the photoconductor drum 32 (see FIG. 1), which is an irradiation object, is irradiated with the light.

Each light emitter 44 includes a driving substrate 72 that is attached to the support 60 via an attachment tool 70. In other words, due to the attachment tool 70, a gap is formed between the support 60 and the driving substrate 72. Here, the driving substrate 72 is an example of a substrate. The driving substrate 72 extends in the one direction (the direction of arrow Z), and is disposed along a side surface of the support 60. The length of the driving substrate 72 in the one direction is smaller than the length of the support 60 in the one direction. The driving substrate 72 is a substrate for driving the light emitter 44. For example, an application specific integrated circuit (ASIC) substrate or the like is used as the driving substrate 72.

The support 60 is formed of a rectangular-parallelepiped-shaped member. In the present exemplary embodiment, the support 60 is formed of a metal block, as with the base 42. For example, the support 60 is made of steel or stainless steel. Here, the base 42 may be formed of a metal block of a metal other than steel or stainless steel. For example, a metal block of aluminum, which has a higher heat conductivity and a lighter weight than steel or stainless steel, may be used. However, a difference in thermal expansion coefficient between the base 42 and the support 60 may cause strain or warping. Thus, in view of suppression of stress and warping, the base 42 and the support 60 may be made of the same material.

A screw hole 74, into which the shaft portion 58B of the fastening member 58 is screwed, is formed in a surface of the support 60 on the base 42 side. The screw hole 74 is provided at a position that faces the through-hole 84 of the base 42.

The shaft portion 58B of the fastening member 58 is fastened to the screw hole 74 of the support 60 via the spacer 56, in a state in which the fastening member 58 is screwed into the recessed portion 82 of the base 42 and the shaft portion 58B of the fastening member 58 extends through the through-hole 84 of the base 42. Thus, the light emitter 44 is fixed to the base 42 by the fastening member 58 from the inside of the recessed portion 82 of the base 42. The spacer 56 is interposed between the base 42 and the support 60 in the state in which the light emitter 44 is fixed to the base 42 by the fastening member 58.

Here, it may be possible to use a method of fixing the light emitter 44 to the front side of the base 42 from the front side (emission side) of the support 60 by using the fastening member 58. However, the support 60 of the present exemplary embodiment is formed of a metal block, which has a larger mass than a support made of a resin material or a support formed of a metal plate. Thus, the fastening member 58 needs to have a size corresponding to the mass thereof. In this case, it is necessary to provide, on the front side of the support 60, a space for the fastening member 58 having a large size, and the support 60 needs to have a large size. For this reason, in the present exemplary embodiment, the light emitter 44 is fixed from the back surface side of the support 60.

Moreover, in a configuration in which the fastening members 58 are provided not only at both end portions but also at a middle part of the support 60, it is difficult to fasten the light emitter 44 from the front side of the support 60 because the light source 64 is present at the middle part. For this reason, the light emitter 44 is fastened from the back side of the base 42 so that it is sufficient to fix the light emitter 44 from the back side in a configuration such that both end portions and a middle part of the support 60 are fastened.

The screw hole 74 and the recessed portion 82 of the base 42 are provided at positions that overlap the light source 64 as seen in the optical-axis direction of the light source 64. With this configuration, it is easy to dissipate heat of the light source 64 to the base 42 via the fastening member 58, compared with a case where the screw hole 74 and the recessed portion 82 are provided at positions that do not overlap the light source 64.

The length of the light emitter 44 in the height direction is larger than the length of the light emitter 44 in the width direction perpendicular to the one direction (the direction of arrow Z). That is, the length of the light emitter 44 in the up-down direction (the direction of arrow Y) is larger than the length of the light emitter 44 in the transversal direction (the direction of arrow X). Therefore, the center of gravity of the light emitter 44 is high, compared with a case where the length of the light emitter in the height direction is smaller than the length of the light emitter in the width direction perpendicular to the one direction.

Figure 7:
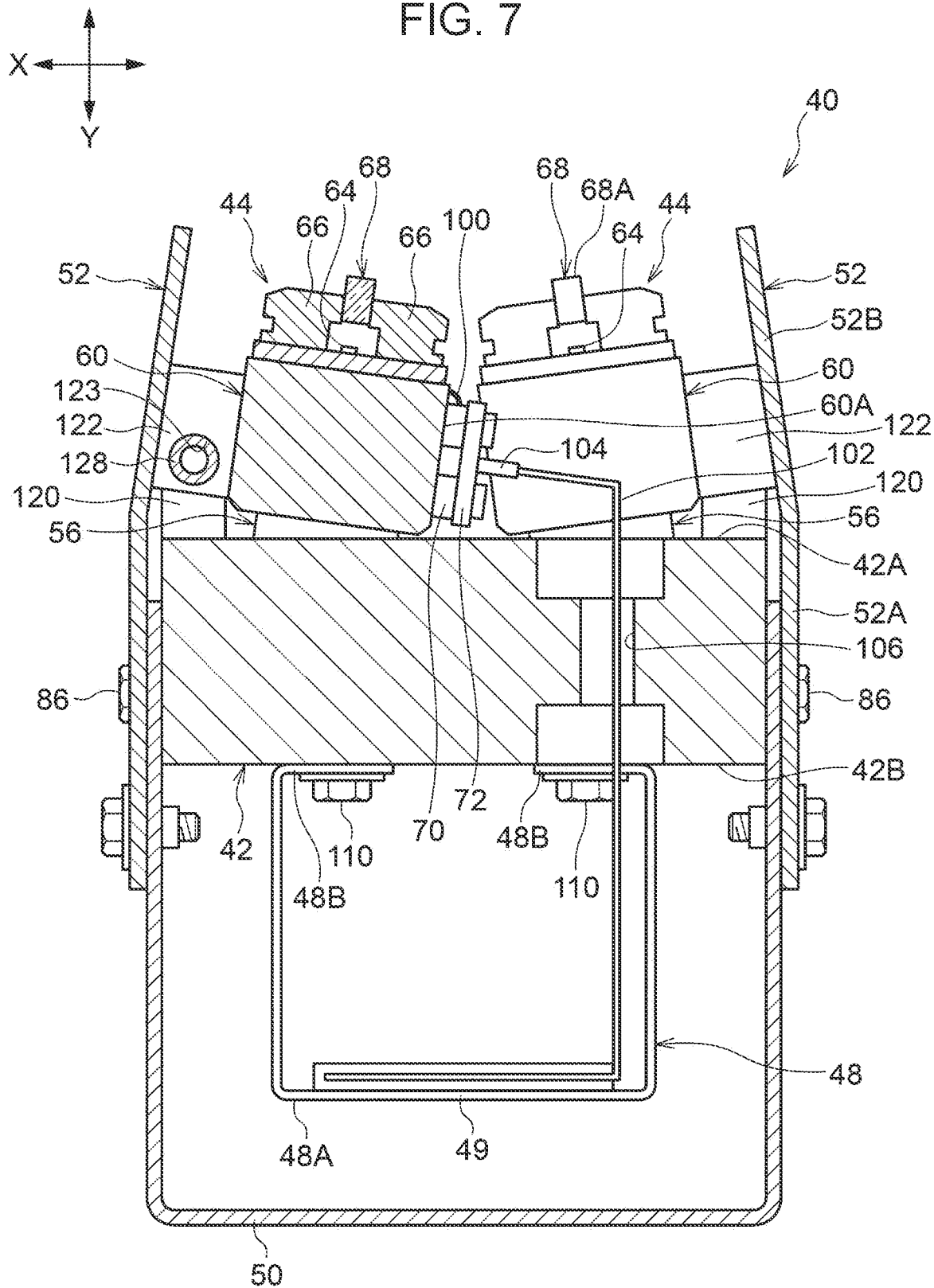
FIG. 7 is a sectional view of the exposure device that is cut in the transversal direction.

As illustrated in FIG. 7, a flexible cable 100, which is connected to the light-emitting element substrate 62, extends from an upper part of a side wall 60A of the support 60 to the outside of the support 60. The flexible cable 100, which extends to the outside of the support 60, is connected to the driving substrate 72. Moreover, a flat cable 102 is connected to a middle part of the driving substrate 72 in the one direction via a connector 104. The connector 104 is disposed on the driving substrate 72 in a direction opposite to the support 60, and the flat cable 102 extends from the driving substrate 72 toward a side opposite to the support 60 via the connector 104. Here, the flat cable 102 is an example of wiring.

A through-portion 106, which extends though the base 42 in the up-down direction (the direction of arrow Y), is formed in the base 42 at a position corresponding to a position where the flat cable 102 is connected to the driving substrate 72 via the connector 104. The through-portion 106 is provided at a position, in the transversal direction of the base 42 (the direction of arrow X), on a lateral side of the driving substrate 72 of the base 42 and on a side opposite to the one light emitter 44 including the driving substrate 72 (that is, a position where the light emitter 44 is not disposed). The flat cable 102 extends to the inside of the lower cover 50 on the back surface 42B side of the base 42 by being inserted through the through-portion 106 of the base 42.

As illustrated in FIGS. 4 and 5, in each of the three light emitters 44, the driving substrate 72 is provided, and the flat cable 102 is connected to the driving substrate 72 via the connector 104. In the base 42, the through-portion 106 is provided on a lateral side of the driving substrate 72 of each of the three light emitters 44. The flat cable 102 of each of the three light emitters 44 extends to the inside of the lower cover 50 on the back surface 42B side of the base 42 by being inserted through the through-portion 106 of the base 42.

Spacer 56

As illustrated in FIG. 6, the spacer 56 is interposed between the base 42 and the light emitter 44 in the optical-axis direction of the light source 64. As an example, the spacer 56 has a plate-like shape and is formed of one member (that is, a single member). In the present exemplary embodiment, the spacer 56 is U-shaped as seen in the optical-axis direction of the light source 64. The spacer 56 includes a body portion 56A and a recessed portion 56*b* that is cut out from one edge of the body portion 56A.

The spacer 56 is disposed on the inclined surface 80A of the recess 80 of the base 42. At a position where the spacer 56 is disposed on the inclined surface 80A, the thickness of the spacer 56 is larger than or equal to the depth of the recess 80. The fastening member 58 fixes the light emitter 44 to the base 42 in such a manner that the spacer 56 receives a compression load.

Bracket 48

As illustrated in FIG. 7, the bracket 48 includes a support portion 48A that is U-shaped and that protrudes from the back surface 42B of the base 42 toward a side opposite to the light emitter 44, and a pair of attachment portions 48B that are bent from upper end portions of the support portion 48A toward an inner side (that is, toward an inner side in the transversal direction of the base 42). The support portion 48A includes, at a middle part on the lower side of the U-shape, a flat portion 49 that faces the back surface 42B of the base 42. The support portion 48A has a shape such that a part thereof on a side opposite to the flat portion 49 opens toward the base 42 side. The pair of attachment portions 48B are attached to the base 42 by using fastening members 110 in a state of being in surface-contact with the back surface 42B of the base 42.

The plural brackets 48 are disposed at intervals in the one direction of the base 42 (the direction of arrow Z) (see FIG. 5). The flat cable 102 is held on the flat portion 49 of the support portion 48A. The flat cable 102 is disposed so as to extend in the one direction of the base 42 (the direction of arrow Z) inside the lower cover 50 by being supported by the plural brackets 48.

Lower Cover 50

Figure 8:
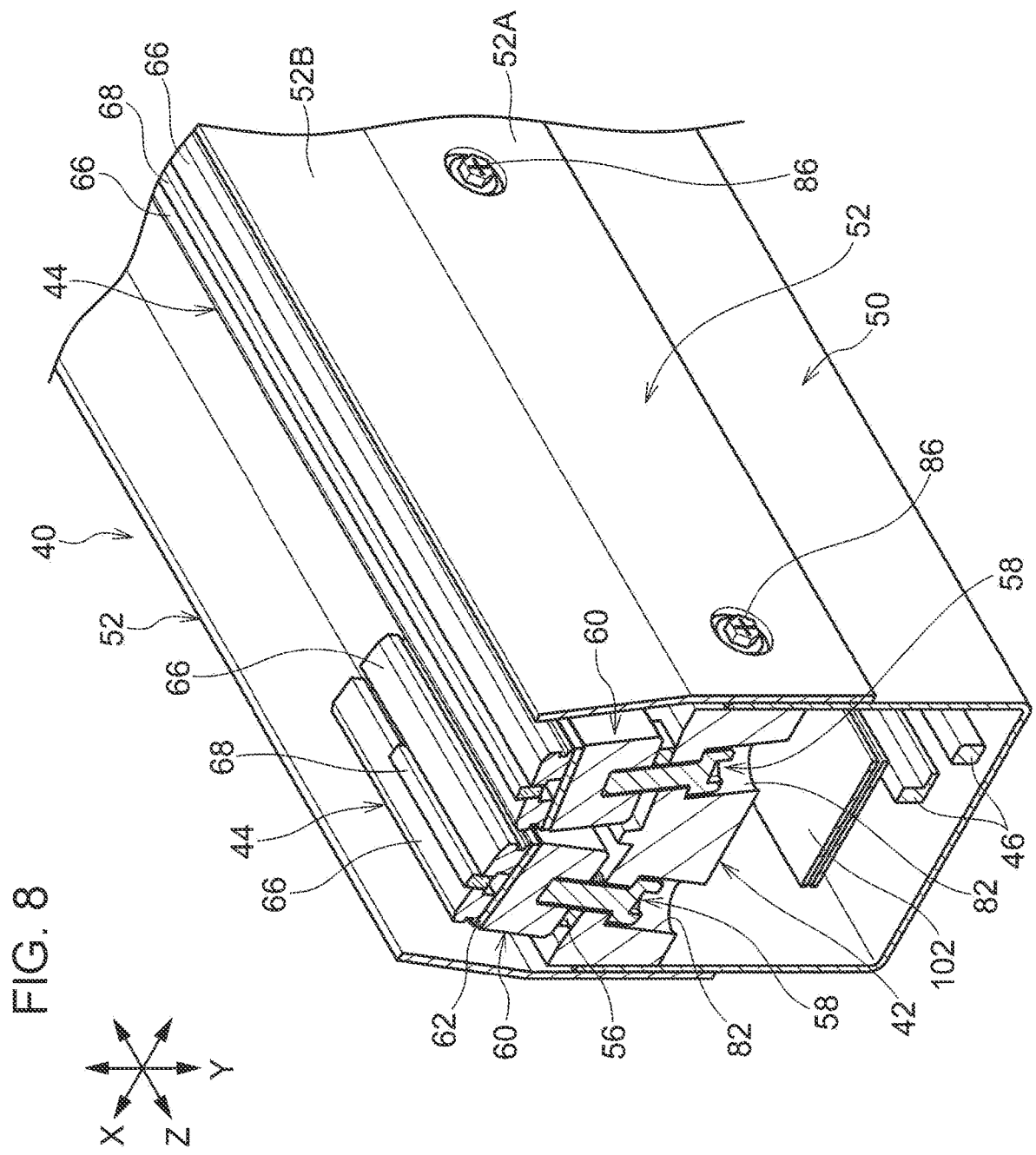
FIG. 8 is a perspective view of the exposure device that is cut in the transversal direction.

As illustrated in FIG. 8, the lower cover 50 covers the harness 46 and the flat cable 102 that are connected to each of the three light emitters 44. The lower cover 50 is attached to the lower side of the base 42 in the up-down direction (that is, the back surface 42B side of the base 42 illustrated in FIG. 5), protrudes from the base 42 toward a side opposite to the light emitter 44, and covers a part of the back surface 42B of the base 42. In the present exemplary embodiment, the lower cover 50 has a U-shaped cross section, and upper end portions of the lower cover 50 are attached to both sides of the base 42 in the transversal direction (the direction of arrow X) by using plural fastening members 86.

The lower cover 50 is configured so as to raise the position of the base 42 when the lower cover 50 is placed horizontally on a lower surface thereof, compared with a case where the lower cover 50 is removed from the base 42. Because the base 42 is formed of a metal block, the center of gravity of the exposure device 40 is raised as the position of the base 42 is raised.

The length of the lower cover 50 in the one direction (the direction of arrow Z) is larger than the length of the base 42 in the one direction (the direction of arrow Z). In other words, the area of the lower cover 50 is smaller than the area of the base 42 as seen from the back surface 42B side of the base 42. The handle portions 90 of the base 42 in the one direction are exposed further toward the outside in the one direction than the lower cover 50.

Side Cover 52

As illustrated in FIGS. 2, 7, and 8, the side covers 52 are provided at both end portions of the base 42 in the transversal direction (the direction of arrow X). The side covers 52 are disposed on the lateral sides of the three light emitters 44 so as to extend in the one direction (the direction of arrow Z). Thus, the side covers 52 have a function of protecting the three light emitters 44 from the outside.

The side covers 52 are provided at positions that overlap the three light emitters 44 in a side view of the exposure device 40 (as seen in the direction of arrow X). The length of the side covers 52 in the one direction (the direction of arrow Z) is larger than the length of a longitudinal region of the base 42 where the three light emitters 44 are disposed (see FIGS. 2 and 3).

Each side cover 52 is plate-shaped, and a plate-shaped surface thereof is disposed so as to extend in the one direction (the direction of arrow Z) and in the up-down direction (the direction of arrow Y). End portions of the side cover 52 in the one direction (the direction of arrow Z) protrude to both sides of a region, in the one direction (the direction of arrow Z), where the three light emitters 44 are disposed. The side cover 52 is an example of a plate-shaped member. As an example, the side cover 52 includes a lower side wall 52A that is flat and that is disposed on a lower side in the up-down direction, and an upper side wall 52B that is flat and that is inclined from an upper end portion of the lower side wall 52A toward the light emitter 44 (see FIG. 7). The lower side wall 52A of the side cover 52 is attached to a side surface of the base 42 by using the fastening member 86 (see FIG. 8). As an example, the lower side wall 52A of the side cover 52 is attached to a side surface of the base 42 from the outside of the lower cover 50 by using the fastening member 86. The side cover 52 is attached to the base 42 in such a way that the side cover 52 can be removed from the base 42 by removing the fastening member 86.

The height of an upper end portion of the side cover 52 (upper end portion of the upper side wall 52B) in the up-down direction (the direction of arrow Y) is larger than the height of an upper surface 68A of the lens portion 68. In other words, the height of the side cover 52 in the optical-axis direction of the light source 64 is larger than the height of the upper surface 68A of the lens portion 68 (see FIG. 6). Here, the upper surface 68A of the lens portion 68 is an example of a lens surface. In the present exemplary embodiment, the upper surface 68A of the lens portion 68 is disposed below an imaginary line that connects upper ends of the pair of side covers 52.

As illustrated in FIG. 7, a support portion 122, which supports the side cover 52, is provided inside of the side cover 52. An attachment portion 120 is provided at an end portion of the front surface 42A of the base 42 in the transversal direction (the direction of arrow X), and the support portion 122 is supported by the attachment portion 120. One side of the support portion 122 in the width direction is in contact with the support 60, and the other side of the support portion 122 in the width direction is in contact with an inner surface of the side cover 52. The support portion 122 has a function of supporting the side cover 52 so that the side cover 52 may not fall toward the light emitter 44 by being in contact with the side cover 52. The support portion 122 is provided for each of the side covers 52 on both sides of the base 42 in the transversal direction. Although illustration is omitted, plural support portions 122 are disposed at intervals in the one direction of the side cover 52 (the direction of arrow Z).

The driving substrate 72 and the flat cable 102 that is connected to the driving substrate 72 are disposed between the light emitter 44 and the side cover 52 (see FIG. 7). In the present exemplary embodiment, the driving substrate 72 and the flat cable 102 are disposed below an imaginary line that connects the upper ends of the pair of side covers 52.

The cleaning device 54 includes a cleaning portion 126 that has a strip-like shape and that cleans the upper surface 68A of the lens portion 68 (see FIG. 2). The cleaning portion 126 is disposed in a direction intersecting the lens portion 68. The cleaning device 54 includes a shaft 128 that is coupled to the cleaning portion 126 and that moves the cleaning portion 126 in the one direction of the lens portion 68 (the direction of arrow Z). Here, the shaft 128 is an example of a cleaning member. A hole 123, through which the shaft 128 is inserted, is formed in some of the plural support portions 122. The support portions 122 have a function of a guide portion that guides the shaft 128.

The shaft 128, the support portion 122, and the attachment portion 120 are disposed between the side cover 52 and the light emitter 44 (see FIG. 7). In the present exemplary embodiment, the shaft 128, the support portion 122, and the attachment portion 120 are disposed below an imaginary line that connects the upper ends of the pair of side covers 52.

Actions and Effects

Next, actions and effects of the present exemplary embodiment will be described.

The exposure device 40 includes the base 42 that extends in the one direction (the direction of arrow Z) and that is formed of a metal block, and the three light emitters 44 in each of which the plural light sources 64 (see FIG. 6) that are arranged in the one direction are supported by the support 60 that extends in the one direction.

In the exposure device 40, the base 42 is disposed over the entire length of the photoconductor drum 32 in the axial direction. The three light emitters 44 are disposed so as to be displaced from each other in the one direction of the base 42, and one or more of the three light emitters 44 face a region of the photoconductor drum 32 in the axial direction where a photoconductor is provided. With the exposure device 40, because the photoconductor drum 32 is irradiated with light from the light emitters 44, an electrostatic latent image is formed on the region of the photoconductor drum 32 where the photoconductor is provided.

In the exposure device 40 described above, the three light emitters 44 are provided on the base 42 formed of a metal block. Therefore, the mass of the entirety of the exposure device 40 is large, compared with a case where the three light emitters are provided on a metal plate.

For example, in a configuration in which the entirety of an exposure device has a large mass has a problem in that, if the exposure device, which includes a base and plural light emitters, falls sideways when during an operation of the exposure device, components, such as the plural light emitters on the base or wiring, are likely to receive an impact due to the mass of the exposure device. Here, examples of "during an operation" include during a manufacturing process, during a maintenance operation, and the like.

In the exposure device 40 according to the present exemplary embodiment, the side cover 52, which is disposed on a lateral side of the three light emitters 44 so as to extend in the one direction, is provided at an end portion of the base 42 in the transversal direction. The side cover 52 has a function of protecting the three light emitters 44 on the base 42 from the outside. Therefore, with the exposure device 40, an impact on a component of the light emitters 44 when the exposure device 40 falls sideways may be suppressed, compared with a case where the light emitters are exposed to the outside. Here, the term "impact" refers to direct contact of something with a component of the light emitters when the exposure device falls. With the present exemplary embodiment, the side cover 52 may prevent direct contact of something with a component of the light emitters 44 when the exposure device 40 falls sideways.

In the exposure device 40, the side cover 52 is disposed at a position that overlaps the three light emitters 44 in a side view. Therefore, with the exposure device 40, an impact to a component of the light emitters 44 when the exposure device 40 falls sideways may be suppressed, compared with a case where a part of plural light emitters is exposed from the protective member in a side view.

In the exposure device 40, the length of the side covers 52 in the one direction is larger than the length of a longitudinal region of the base 42 where the three light emitters 44 are disposed. Therefore, with the exposure device 40, an impact to a component of the light emitters 44 when the exposure device 40 falls sideways may be suppressed, compared with a case where the length of the protective member in the one direction is the same as the length of the longitudinal region where the plural light emitters are disposed.

In the exposure device 40, the side cover 52 is a plate-shaped member that is disposed so as to extend in the one direction. Therefore, with the exposure device 40, increase in the weight of the exposure device 40 may be suppressed, compared with a case where the protective member has a block-like shape.

In the exposure device 40, the height of the side cover 52 in the optical-axis direction of the light sources 64 is larger than the height of the upper surface 68A of the lens portion 68. Therefore, with the exposure device 40, the lens portion 68 may be protected, compared with a case where the height of the protective member in the optical-axis direction of the light sources is smaller than the height of the lens surface.

In the exposure device 40, the side cover 52 is removable. Therefore, with the exposure device 40, the side cover 52 may not obstruct removal of the light emitter 44, compared with a case where the protective member is not removable from a device body.

In the exposure device 40, the side cover 52 is removably attached to the base 42. Therefore, with the exposure device 40, the attachment structure of the side cover 52 may be simplified, compared with a case where the protective member is removably attached to the light emitters.

In the exposure device 40, a component of the cleaning device 54 such as the shaft 128, the driving substrate 72 of the light emitter 44, and the flat cable 102 from the light emitter 44 are disposed between the side cover 52 and the light emitter 44. Therefore, with the exposure device 40, in a configuration such that the component of the cleaning device 54, the driving substrate 72, and the flat cable 102 are disposed between the side cover 52 and the light emitter 44, the side cover 52 may protect the component of the cleaning device 54, the driving substrate 72, and the flat cable 102.

In the exposure device 40, the bracket 48, which raises the position the base 42 when placed horizontally, and the lower cover 50, which covers the bracket 48, are attached to an end portion of the base 42 on a side opposite to the light emitters 44. Therefore, with the exposure device 40, in a configuration such that the center of gravity of the exposure device 40 is raised by the bracket 48 and the lower cover 50 that are attached to an end portion of the base 42 on a side opposite to the light emitter 44, an impact to a component of the light emitters 44 when the exposure device 40 falls sideways may be suppressed, compared with a case where the light emitters are exposed to the outside.

In the exposure device 40, the length of the light emitter 44 in the height direction is larger than the length of the light emitter 44 in the width direction perpendicular to the one direction. Therefore, with the exposure device 40, in a configuration such that the center of gravity of the exposure device 40 is raised because the length of the light emitter 44 in the height direction is larger than the length of the light emitter 44 in the width direction, an impact to a component of the light emitters 44 when the exposure device 40 falls sideways may be suppressed, compared with a case where the light emitters are exposed to the outside.

In the exposure device 40, the support 60 of each of the light emitters 44 is formed of a metal block. Therefore, with the exposure device 40, in a configuration such that the center of gravity of the exposure device 40 is raised because the support 60 is formed of a metal block, an impact to a component of the light emitters 44 when the exposure device 40 falls sideways may be suppressed, compared with a case where the light emitters are exposed to the outside.

In the exposure device 40, the support 60 of the light emitters 44 is made of stainless steel or steel. The specific gravity of stainless steel and steel is about three times the specific gravity of aluminum alloys. Therefore, with the exposure device 40, in a configuration such that the center of gravity of the exposure device 40 is raised because the base 42 is made of stainless steel or steel, an impact to a component of the light emitters 44 when the exposure device 40 falls sideways may be suppressed, compared with a case where the light emitters are exposed to the outside.

The image forming apparatus 10 includes the exposure device 40 and the photoconductor drum 32 that moves relative to the exposure device 40 in a direction intersecting the one direction (Z direction) and that is to be irradiated with light from the exposure device 40. The surface of the photoconductor drum 32 has a region where a photosensitive material is disposed. Therefore, with the image forming apparatus 10, an impact to a component of the light emitters 44 may be suppressed during an operation of the image forming apparatus 10, compared with a case where the light emitters of the exposure device are exposed to the outside.

In the image forming apparatus 10, the region where a photosensitive material is disposed is provided on the surface of the photoconductor drum 32 that is a cylindrical member that rotates in a circumferential direction. Therefore, with the image forming apparatus 10, in a configuration including the photoconductor drum 32, an impact to a component of the light emitters 44 during an operation of the image forming apparatus 10 may be suppressed.

There may be a case where the exposure device 40 does not have the lower cover 50. In this case, when the bracket 48 is placed horizontally, the position of the base 42 is higher than that of a case where the bracket 48 is removed from the base 42. Therefore, in a configuration such that the center of gravity of the exposure device 40 is raised by the bracket 48 that is attached to an end portion of the base 42 on a side opposite to the light emitters, an impact to a component of the light emitters 44 when the exposure device 40 falls sideways may be suppressed, compared with a case where the light emitters are exposed to the outside.

Second Exemplary Embodiment

Next, an exposure device according to a second exemplary embodiment will be described. In the second exemplary embodiment, elements, members, and the like that are the same as those of the first exemplary embodiment will be denoted by the same reference numerals, detailed descriptions will be omitted, and differences will be described.

Figure 9:
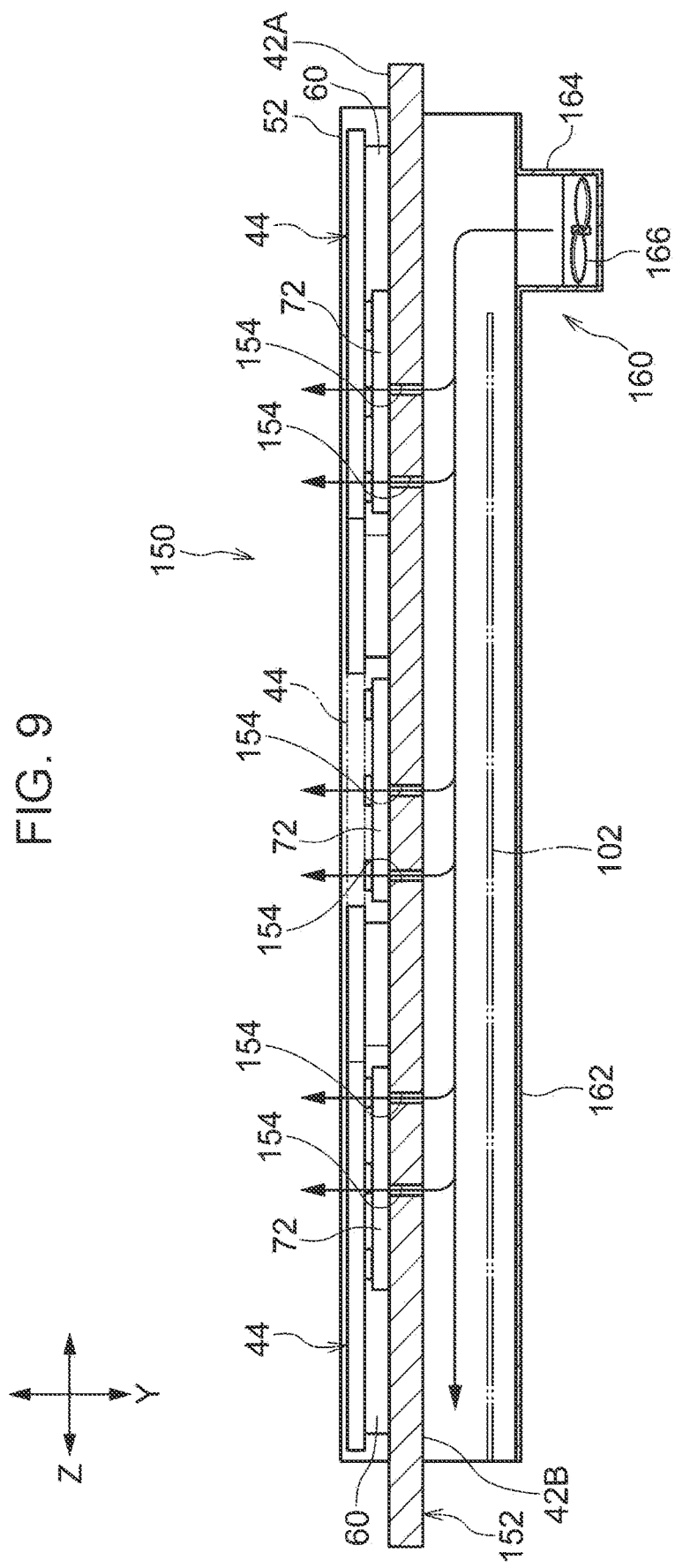
FIG. 9 is a sectional view illustrating an air supply device of an exposure device according to a second exemplary embodiment that is cut in a longitudinal direction of a base.

FIG. 9 illustrates an exposure device 150 according to the second exemplary embodiment. The exposure device 150 includes a base 152 and an air supply device 160 that is disposed along the base 152. In the exposure device 150, the base 152 and the air supply device 160 are changed, and the other components are similar to those of the exposure device 40 according to the first exemplary embodiment. That is, the side covers 52, which are provided on the lateral sides of the three light emitters 44, are provided at both end portions of the base 152 in the transversal direction.

The base 152 is formed of a rectangular-parallelepiped metal block. The base 152 includes supply paths 154 that respectively blow air toward the three light emitters 44. As an example, the supply paths 154 extend through the base 152 in the up-down direction (the direction of arrow Y). Plural (in the present exemplary embodiment, two) supply paths 154 are provided in the base 152 on the lower side of the driving substrate 72 of the light emitter 44 in the up-down direction (the direction of arrow Y).

The air supply device 160 includes a lower cover 162 that is attached to an end portion of the base 152 on a side opposite to the light emitter 44 and through which air flows. The lower cover 162 is configured to raise the position of the base 152 when placed horizontally. Here, the lower cover 162 is an example of another member and an example of a flow-path member. The lower cover 162 has a U-shaped cross section in the transversal direction of the base 152, and upper end portions of the lower cover 162 are attached to side surfaces of the base 152 by using fastening members (not shown). The lower cover 162 covers the back surface 42B side of the base 152, and is disposed so as to extend in the one direction of the base 152 (the direction of arrow Z).

The air supply device 160 includes a tubular portion 164 that extends toward a lower side from one end of the lower cover 162 in the one direction (the direction of arrow Z), and a fan 166 that is provided in a lower end portion of the tubular portion 164.

Inside the lower cover 162, the flat cable 102 that is connected to each of the light emitters 44 is disposed so as to extend in the one direction of the base 152 (the direction of arrow Z). The lower cover 162 also serves as a cover that covers the flat cable 102.

With the air supply device 160, air is guided to the inside of the lower cover 162 through the tubular portion 164 as the fan 166 rotates. The air flows through the inside of the lower cover 162 in the one direction (the direction of arrow Z) toward an end portion on a side opposite to the tubular portion 164. While flowing in the one direction of the base 152 (the direction of arrow Z), the air passes through the plural supply paths 154 of the base 152, and is blown toward the driving substrates 72 of the respective light emitters 44.

The exposure device 150 described above has the following actions and effects in addition to the actions and effects similar to those of the exposure device 40 according to the first exemplary embodiment.

In the exposure device 150, the lower cover 162 forms a flow path through which air is blown to the light emitter 44. Therefore, with the exposure device 150, in a configuration such that the center of gravity of the exposure device 150 is raised by the lower cover 162 at an end portion of the base 152 on a side opposite to the light emitter 44, an impact to a component of the light emitters 44 when the exposure device 150 falls sideways may be suppressed, compared with a case where the light emitters are exposed to the outside.

Third Exemplary Embodiment

Figure 10:
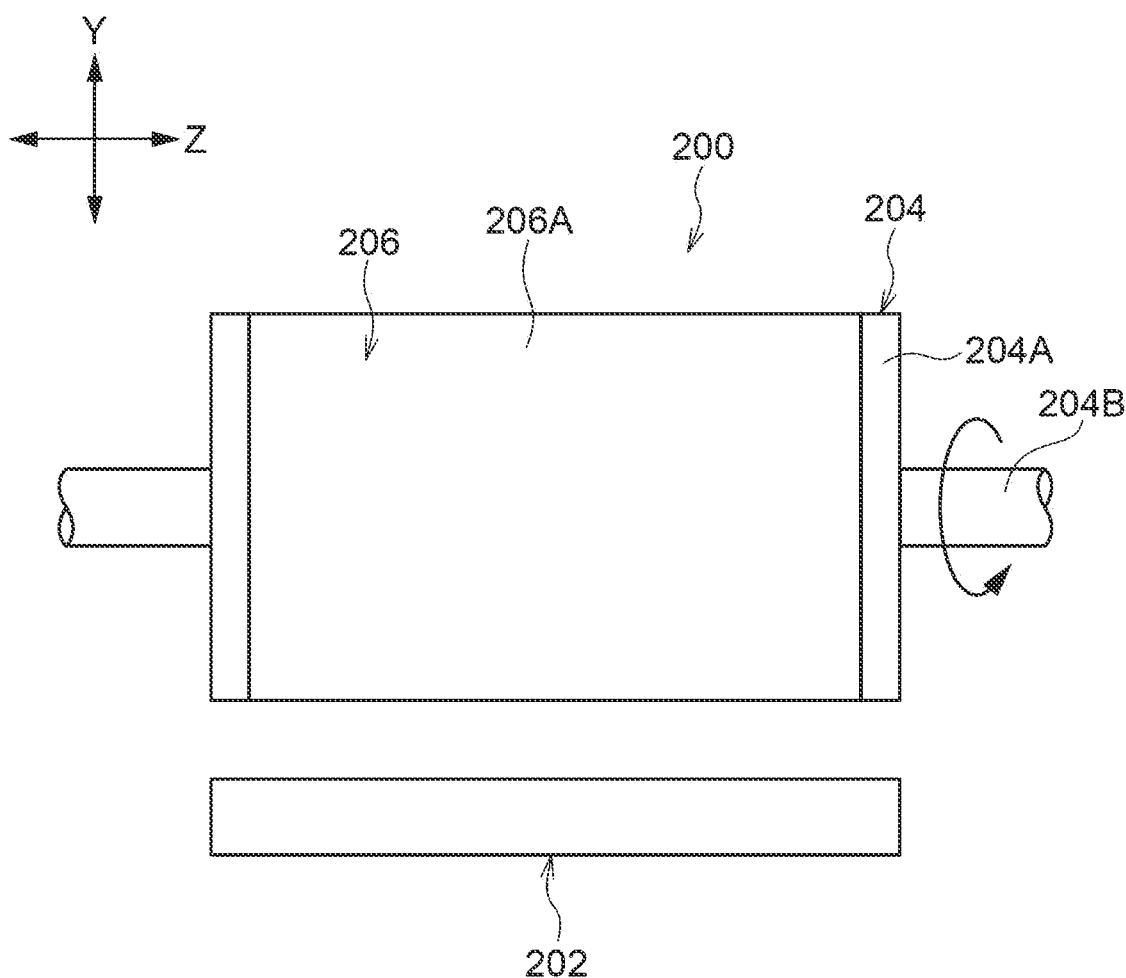
FIG. 10 illustrates a drawing apparatus including a light emitting device according to a third exemplary embodiment.

FIG. 10 illustrates a drawing apparatus 200 including a light emitting device 202 according to a third exemplary embodiment. Elements of the third exemplary embodiment that are the same as those of the first exemplary embodiment will be denoted by the same reference numerals and descriptions thereof will be omitted.

As illustrated in FIG. 10, the drawing apparatus 200 includes the light emitting device 202, and a cylindrical member 204 that is disposed so as to extend in the longitudinal direction of the light emitting device 202 and that rotates in a circumferential direction.

The light emitting device 202 has a configuration similar to that of the exposure device 40 according to the first exemplary embodiment.

The cylindrical member 204 includes a cylindrical portion 204A and a shaft 204B that extends toward both sides of the cylindrical portion 204A. The shaft 204B is rotatably supported by a frame (not shown), and the cylindrical portion 204A rotates in the circumferential direction as the shaft 204B rotates.

A substrate 206 is attached to a surface of the cylindrical portion 204A. The surface of the substrate 206A has a region 206A where a photosensitive material is disposed. The substrate 206 is, as an example, a plate for computer-to-plate (CTP) used in a plate-making process of offset printing. The region 206A, where a photosensitive material is disposed, is, as an example, a region where a photosensitive material such as a photoresist is applied.

With the drawing apparatus 200, the region 206A of the substrate 206 where a photosensitive material is disposed is irradiated with light having a predetermined pattern emitted from the light emitting device 202 while the cylindrical member 204 rotates. Thus, an image having the predetermined pattern is formed in the region 206A of the substrate 206 where the photosensitive material is disposed. By subsequently developing the substrate 206, a plate used in an offset printing apparatus is formed. In this case, as an example, a laser device can be used as a light source of the drawing apparatus 200.

The light emitting device 202 described above has the following actions and effects in addition to actions and effects due to configurations similar to those of the exposure device 40 according to the first exemplary embodiment.

With the drawing apparatus 200 including the light emitting device 202 described above, an impact to a component of the light emitters 44 during an operation of the drawing apparatus 200 may be suppressed, compared with a case where the light emitters of the light emitting device are exposed to the outside.

Moreover, with the drawing apparatus 200, in a configuration including the cylindrical member 204, an impact to a component of the light emitters 44 during an operation of the drawing apparatus 200 may be suppressed.

In the drawing apparatus 200, the light emitting device 202 may be changed to have a configuration similar to that of the exposure device 150 according to the second exemplary embodiment, instead of a configuration similar to that of the exposure device 40 according to the first exemplary embodiment.

Additional Description

In the exposure devices according to the first and second exemplary embodiments and the light emitting device according to third exemplary embodiment, three light emitters are disposed on the base. However, the present disclosure is not limited to this configuration. For example, one light emitter may be disposed on the base, two light emitters may be disposed on the base, or four or more light emitters may be disposed on the base. The positions of plural light emitters disposed on the base may be set in any appropriate manner.

In the exposure devices according to the first and second exemplary embodiments and the light emitting device according to third exemplary embodiment, the shape of the base may be changed. Components of the light emitters or the shapes of the components of or light emitters may be changed. In the forgoing description, the support 60 of the light emitter is formed of a metal block. However, the present disclosure is not limited to this. For example, the support may be made of a resin, or may be made of a metal material such as a metal plate.

In the exposure devices according to the first and second exemplary embodiments and the light emitting device according to third exemplary embodiment, the shape of the side cover 52 may be changed. In the foregoing description, the side cover 52 is attached to the base 42. However, the present disclosure is not limited to this. For example, a protective member such as the side cover may be attached to the light emitters or to the lower cover. The protective member may be removably attached to a member other than the base (for example, the light emitters or the lower cover).

In the drawing apparatus 200 according to the third exemplary embodiment, the substrate 206 attached to the cylindrical portion 204A of the cylindrical member 204 is irradiated with light from the light emitting device 202. However, the present disclosure is not limited to this configuration. For example, the substrate may be disposed on a flat table, and the substrate may be irradiated with light from the light emitting device by moving the light emitting device and the table relative to each other in a direction intersecting the one direction of the light emitting device.

In the drawing apparatus 200 according to the third exemplary embodiment, the substrate 206 is a plate for CTP used in a plate-making process of offset printing, and the region 206A of the substrate 206 where a photosensitive material is disposed is irradiated with light from the light emitting device 202. However, the present disclosure is not limited to this configuration. For example, the light emitting device and the drawing apparatus described above can be used for exposure in the process of manufacturing a printed wiring board (PWB). For example, a printed wiring board may be manufactured by directly forming an image on a substrate to which a photosensitive material such as a photoresist has been applied without using a photomask. The substrate used may be a rigid substrate or a flexible substrate. In a case of a flexible substrate, an image may be drawn while rotating the flexible substrate in a state of being fixed to the cylindrical member 204 illustrated in FIG. 10.

Moreover, the light emitting device and the drawing apparatus described above can be used in any of the following processes in which photolithography is used: forming of a color filter in the process of manufacturing a liquid crystal display (LCD); exposure of a dry photoresist (DFR) in the process of manufacturing a thin-film transistor (TFT); exposure of a dry photoresist (DFR) in the process of manufacturing a plasma display panel (PDP); exposure of a photosensitive material such as a photoresist in the process of manufacturing a semiconductor device; exposure of a photosensitive material such as a photoresist in the plate-making process of printing other than offset printing such as gravure printing; or exposure of a photosensitive material in the process of manufacturing parts of a watch; and the like. Here, the term "photolithography" refers to a technology of generating a pattern including an exposed part and an unexposed part by exposing a surface of an object, on which a photosensitive material is disposed, to light in a pattern.

In the light emitting device and the drawing apparatus described above, whichever of the following may be used: a photon-mode photosensitive material, with which information is directly recorded by exposure to light; and a heat-mode photosensitive material, with which information is recorded by heat generated by exposure to light. As a light source of the drawing apparatus 200, an LED device or a laser device may be used depending on an object to be exposed to light.

The present disclosure is not limited to the specific exemplary embodiments that have been described in detail, and it should be clear for a person having ordinary skill in the art that various other exemplary embodiments are within the scope of the present disclosure.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light emitting device comprising:
   a base that extends in one direction and that is formed of a metal block;
   a plurality of light emitters that are disposed on a front surface side of the base so as to be displaced from each other in the one direction and in each of which a plurality of light sources that are arranged in the one direction are supported by a support that extends in the one direction; and
   a protective member that
      is provided at an end portion of the base in a direction intersecting the one direction at a position that overlaps the plurality of light emitters in a side view,
      is disposed on a lateral side of the plurality of light emitters so as to extend in the one direction,
      has a length in the one direction that is larger than a length of a longitudinal region of the base where the plurality of light emitters are disposed, and
      protects the plurality of light emitters from outside.

2. The light emitting device according to claim 1, wherein the protective member is a plate-shaped member that is disposed so as to extend in the one direction.

3. The light emitting device according to claim 2,
   wherein each of the light emitters has a lens surface through which light from the plurality of light sources passes, and
   wherein a height of the protective member in an optical-axis direction of the light sources is larger than a height of the lens surface.

4. The light emitting device according to claim 1,
   wherein each of the light emitters has a lens surface through which light from the plurality of light sources passes, and
   wherein a height of the protective member in an optical-axis direction of the light sources is larger than a height of the lens surface.

5. The light emitting device according to claim 1, wherein the protective member is removable.

6. The light emitting device according to claim 5, wherein the protective member is removably attached to the base.

7. The light emitting device according to claim 1, wherein at least one of a cleaning member that cleans a lens surface of each of the light emitters, a substrate of the light emitter, and wiring from the light emitter is disposed between the protective member and the light emitter.

8. The light emitting device according to claim 1, wherein another member that raises a position of the base when placed horizontally is attached to an end portion of the base on a side opposite to the light emitters.

9. The light emitting device according to claim 8, wherein the other member is a flow-path member through which air to be blown to the light emitters flows.

10. The light emitting device according to claim 8, wherein the other member is a holding member that holds wiring from the light emitters.

11. The light emitting device according to claim 1, wherein a length of each of the light emitters in a height direction is larger than a length of the light emitter in a width direction perpendicular to the one direction.

12. The light emitting device according to claim 1, wherein the support is formed of a metal block.

13. The light emitting device according to claim 12, wherein the support is made of stainless steel or steel.

14. A drawing apparatus comprising:
   the light emitting device according to claim 1; and
   a region that moves relative to the light emitting device in a direction intersecting the one direction and where a photosensitive material to be irradiated with light from the light emitting device is disposed.

15. The drawing apparatus according to claim 14, wherein the region is provided on a surface of a cylindrical member that rotates in a circumferential direction.

* * * * *